(12) United States Patent
Inoue

(10) Patent No.: US 6,298,274 B1
(45) Date of Patent: Oct. 2, 2001

(54) CONVEYANCE SYSTEM IN A SEMICONDUCTOR MANUFACTURING PROCESS AND METHOD FOR PROCESSING SEMICONDUCTOR WAFER THEREIN

(75) Inventor: Katsuhiro Inoue, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/388,194

(22) Filed: Sep. 1, 1999

(30) Foreign Application Priority Data

Nov. 19, 1998 (JP) .................................................. 10-329112

(51) Int. Cl.⁷ ...................................................... G06F 19/00
(52) U.S. Cl. .............................. 700/112; 700/121; 701/23
(58) Field of Search ..................................... 700/112, 113, 700/117, 121, 230; 701/23

(56) References Cited

U.S. PATENT DOCUMENTS

| 5,189,624 | * | 2/1993 | Barlow et al. | 700/169 |
| 5,668,056 | * | 9/1997 | Wu et al. | 438/106 |
| 5,696,689 | * | 12/1997 | Okumura et al. | 700/121 |
| 5,706,200 | * | 1/1998 | Kumar et al. | 700/100 |
| 5,841,661 | * | 11/1998 | Buchanan et al. | 700/121 |
| 6,061,605 | * | 5/2000 | Davis | 700/121 |

FOREIGN PATENT DOCUMENTS

| 8-167641 | 6/1996 | (JP) | H01L/21/68 |
| 9-082773 | 3/1997 | (JP) | H01L/21/68 |
| 9-101820 | 4/1997 | (JP) | G05D/1/02 |
| 10-133706 | 5/1998 | (JP) | G05B/15/00 |

* cited by examiner

Primary Examiner—William Grant
Assistant Examiner—Zoila Cabrera
(74) Attorney, Agent, or Firm—Junichi Mimura

(57) ABSTRACT

A conveyance system in a semiconductor manufacturing process comprises a process unit processing a semiconductor wafer, a conveyer conveying the semiconductor wafer, a conveyer controller controlling the conveyer, and a computer controlling the conveyer and the conveyer controller. In the system, the process unit sends a warning signal to said computer, indicating time of the process completion in the process unit before the process is completed, and the conveyer is moved to the process unit in response to the warning signal.

23 Claims, 7 Drawing Sheets

5A / 5B

CONVEYANCE SYSTEM IN A SEMICONDUCTOR MANUFACTURING PROCESS AND METHOD FOR PROCESSING SEMICONDUCTOR WAFER THEREIN

CROSS-REFERENCE TO RELATED

This application claims the priority benefit of Japanese Patent Application No. 10-329112, filed Nov. 19, 1998, the entire subject matter of which is incorporated herein of reference.

BACKGROUND OF THE INVENTION

1. Field of the Invention

The present invention relates to a conveyance system in a semiconductor manufacturing process and a method for processing semiconductor wafers therein, more particularly, to a method for controlling the conveyance system to shorten a TAT (Turn Around Time) during the semiconductor manufacturing process.

2. Description of the Related Art

In the related art, a semiconductor manufacturing system comprises a wafer storage for temporary storing semiconductor wafers, an automatic conveyer for conveying the semiconductor wafers, a conveyer controller for controlling the automatic conveyer, a process unit for cleaning, drying, and etching the semiconductor wafers, and a computer for administrating and controlling the semiconductor manufacturing system. The semiconductor wafers are conveyed from the wafer storage to the process unit, or from the process unit to the another process unit in response to specific instructions form the computer.

For example, in the case that the semiconductor wafers are conveyed from the process unit A to the process unit B, the computer receives a signal from the process unit A, indicating that a process of the semiconductor wafers has been completed in the process unit A, and then the process unit B which can perform the next process is searched by the computer, and simultaneously, the computer judges whether or not the process unit B is located in the same area of the process unit A or not. In the event that the process unit B is not located in the same area as the process unit A, the computer instructs the conveyer controller to let the semiconductor wafers be conveyed to the wafer storage. In the case that the process units A and B are located in the same area, the computer judges whether or not the semiconductor wafers can be conveyed to the process unit B. If not, the computer instructs the conveyer controller to let the semiconductor wafers be conveyed to the wafer storage. If yes, the computer instructs the conveyer controller to let the semiconductor wafers be conveyed to the process unit B.

However, in the semiconductor manufacturing system mentioned above, since the signal indicating the completion of the process is sent to the computer from the process unit after the process is actually completed, the semiconductor wafers being processed can not be conveyed just after completion of the process. As mentioned above, since the automatic conveyer is moved to the process unit in response to the instruction from the computer, it will take a few minutes to reach the process unit. That is, the semiconductor wafers being processed have to wait at the process unit for a few minutes until the automatic conveyer reaches there. Therefore, the waiting time of the semiconductor wafers being processed which is the period from the time of the process completion until the time of the arrival of the automatic conveyer, causes a delay for the production TAT.

Furthermore, this delay causes another delay in a later process. Further, during the conveyance of the semiconductor wafers from a wafer process unit to the assemble process unit, the semiconductor wafers could be left out of the search list of the computer by the delay even if the semiconductor wafers to be processed in the assemble process should be listed for the computer search. Furthermore, the assemble process unit is halted for awaiting the arrival of the semiconductor wafers where the semiconductor wafers under the conveyance is the only object to be processed.

SUMMARY OF THE INVENTION

It is a general object of the present invention to provide a novel and efficient conveyance system for processing semiconductor wafers.

It is a more specific object of the present invention to provide a conveyance system for processing semiconductor wafers with a warning signal which indicating that a process will be completed soon.

It is an another object of the present invention to provide a conveyance system for processing semiconductor wafers having a signal for confirming whether or not there are semiconductor wafers to be processed in the wafer storage.

It is a still another object of the present invention to provide a conveyance system for processing semiconductor wafers having a watchdog timer for comparing a estimated time of process completion with a time of actual completion of the process.

It is a further object of the present invention to provide a conveyance system for processing semiconductor wafers having a delay timer for delaying an operation of the automatic conveyer to start to move to the process unit.

An advantage of my invention is that it provides the total process time can be reduced, and an operating efficiency can be improved.

To achieve the advantage of the invention, the present invention provides a process unit processing a semiconductor wafer, a conveyer conveying the semiconductor wafer, a conveyer controller controlling the conveyer, and a computer controlling the conveyer and the conveyer controller, wherein the process unit sends a warning signal to the computer, indicating time of the process completion in the process unit before the process is completed, and wherein the conveyer is moved to the process unit by the conveyer controller in response to the warning signal.

To achieve the advantage of the invention, the present invention further provides the conveyer being arranged to arrive at the process unit at the substantially same time as a completion of the process to the semiconductor wafer.

To achieve the advantage of the invention, the present invention further provides a watchdog timer for being set for a estimated time of process completion in the process unit, and wherein the watchdog timer is activated after the computer receives the warning signal.

To achieve the advantage of the invention, the present invention further provides a wafer storage for storing a wafer to be processed in the process unit, wherein the computer checks whether there is a wafer in the wafer storage, wherein the automatic conveyer moves to the wafer storage to pick up the wafer, then move to the process unit if there is the wafer in the wafer storage, and wherein the automatic conveyer moves directly to the process unit without stopping by the wafer storage if there is no wafer.

To achieve the advantage of the invention, the present invention further provides a delay timer for being set for a period of the time equal to the difference between a time that a conveyer reaches the process unit via the wafer storage and a time that a conveyer reaches the process directly, and whereby an operation of the conveyer can be delayed for the period of time equal to the difference when there is no wafers in the wafer storage.

Further to achieve the advantage of the invention, the present invention provides the step of processing the semiconductor wafer in a process unit, sending a warning signal to a computer from the process unit before the process is completed, the warning signal indicating the process is completed in few minutes, sending an instruction to a conveyer controller from the computer, the instruction including information where a automatic conveyer moves to and where the semiconductor wafer is conveyed to, and conveying the semiconductor wafer by the automatic conveyer in response to the instruction.

BRIEF DESCRIPTION OF THE DRAWINGS

The present invention will be more particularly described with reference to the accompanying drawings, in which.

DETAILED DESCRIPTION OF THE PREFERRED EMBODIMENT

Hereinafter, the first embodiment of the present invention will be described in detail with reference to the drawings.

Figure 1:
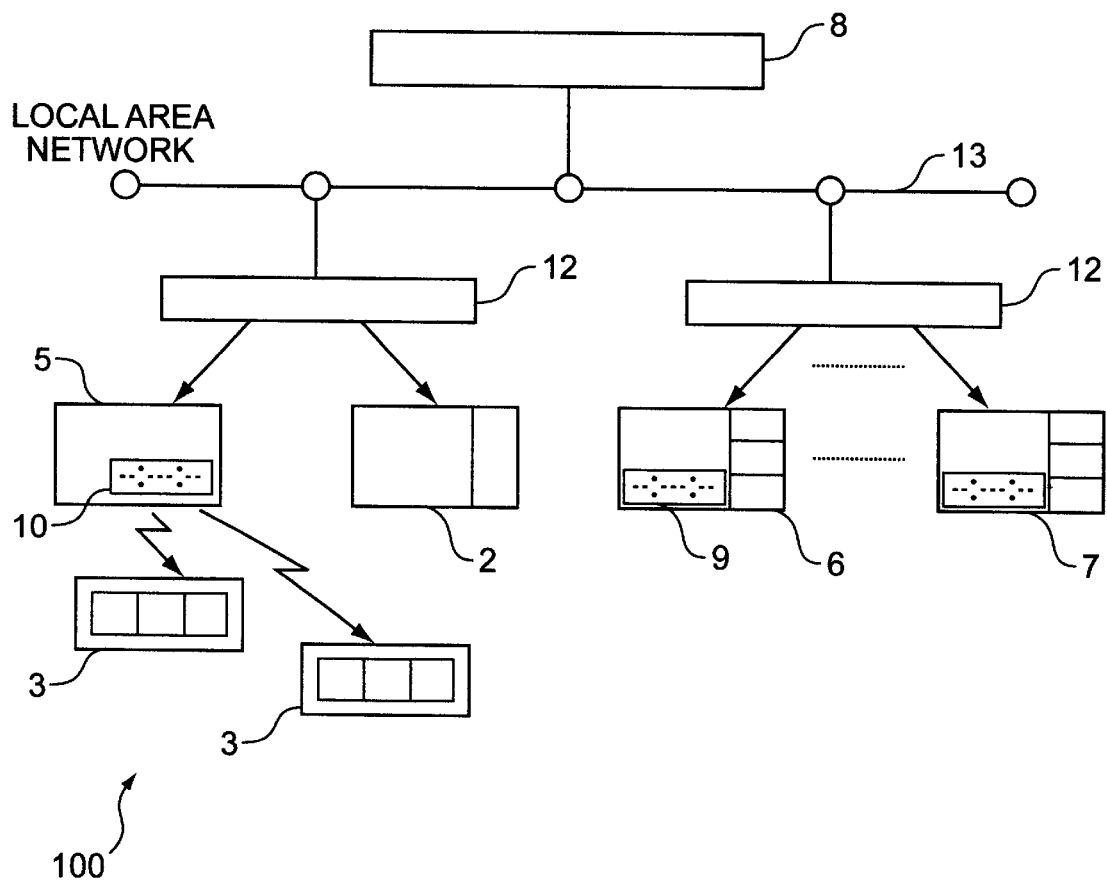
FIG. 1 is a diagram showing a conveyance control system in the manufacturing process of a semiconductor device, of a preferred embodiment of the invention.

Referring to FIG. 1, a semiconductor manufacturing system 100 comprises a wafer storage 2 for temporary storing semiconductor wafers, an automatic conveyers 3 for conveying the semiconductor wafers, a conveyer controller 5 for controlling the automatic conveyers 3, a process units 6 and 7 for cleaning, drying, etching the semiconductor wafers and a computer 8 for administrating the semiconductor manufacturing system 100. The wafer storage 2, the conveyer controller 5 and the process units 6 and 7 are connected to the computer 8 through terminal servers 12 by a communication cable and LAN (Local Area Network) 13, and are controlled by the computer 8. The automatic conveyer 3 which is controlled by the conveyer controller 5 receives information regarding the process unit 7 as the next step and send information regarding the semiconductor wafer on the conveyer 3.

Figure 2:
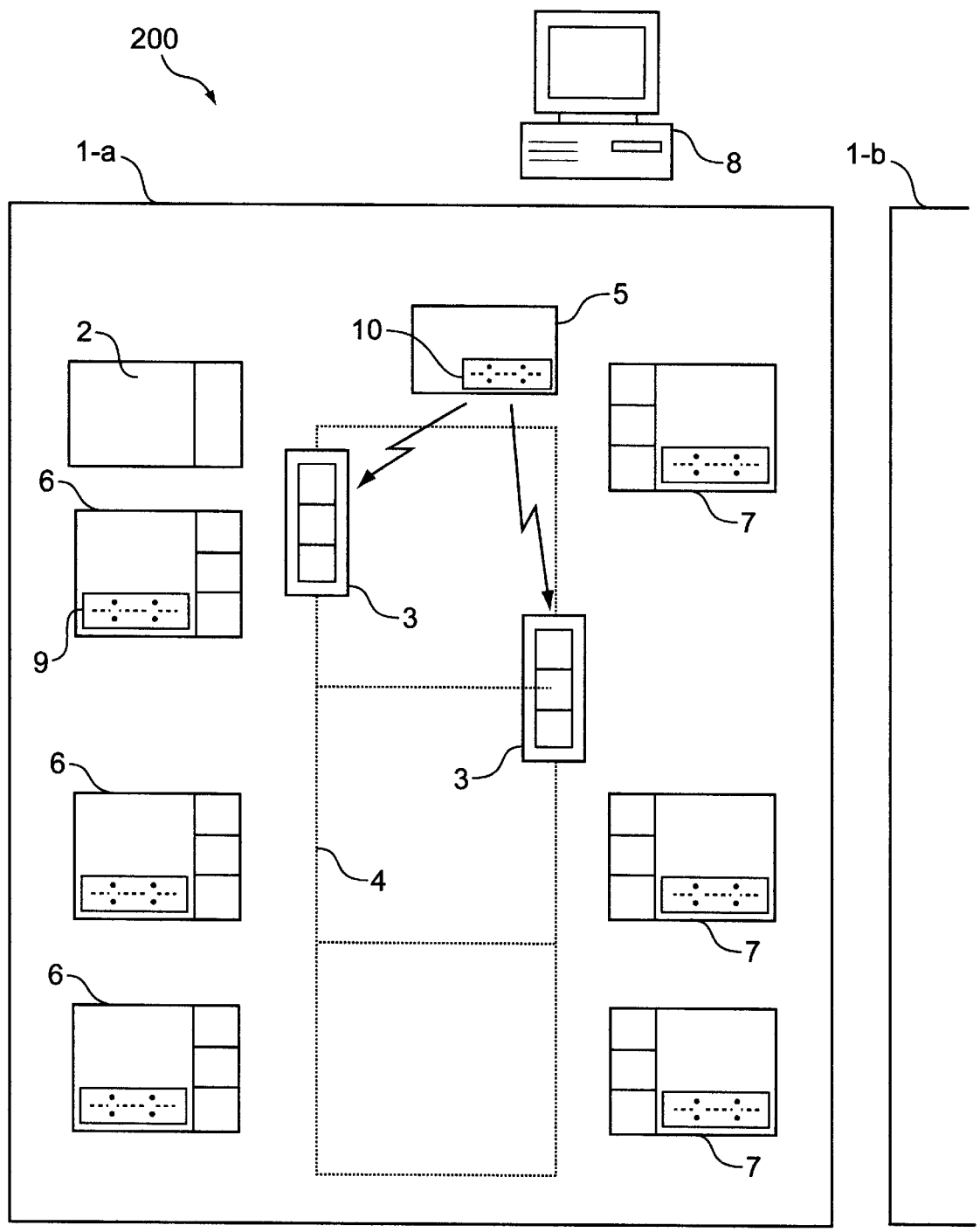
FIG. 2 is a layout showing the conveyance control system in the wafer process, of the preferred embodiment of the invention.

Referring to FIG. 2, the wafer storage 2, the conveyer controllers for controlling the automatic conveyer 3 to run on the conveyer line 4, the process unit 6 and the process unit 7 are arranged in a process area 1-a of the wafer process. This conveyance control system 200 is controlled by the computer 8.

Figure 3:
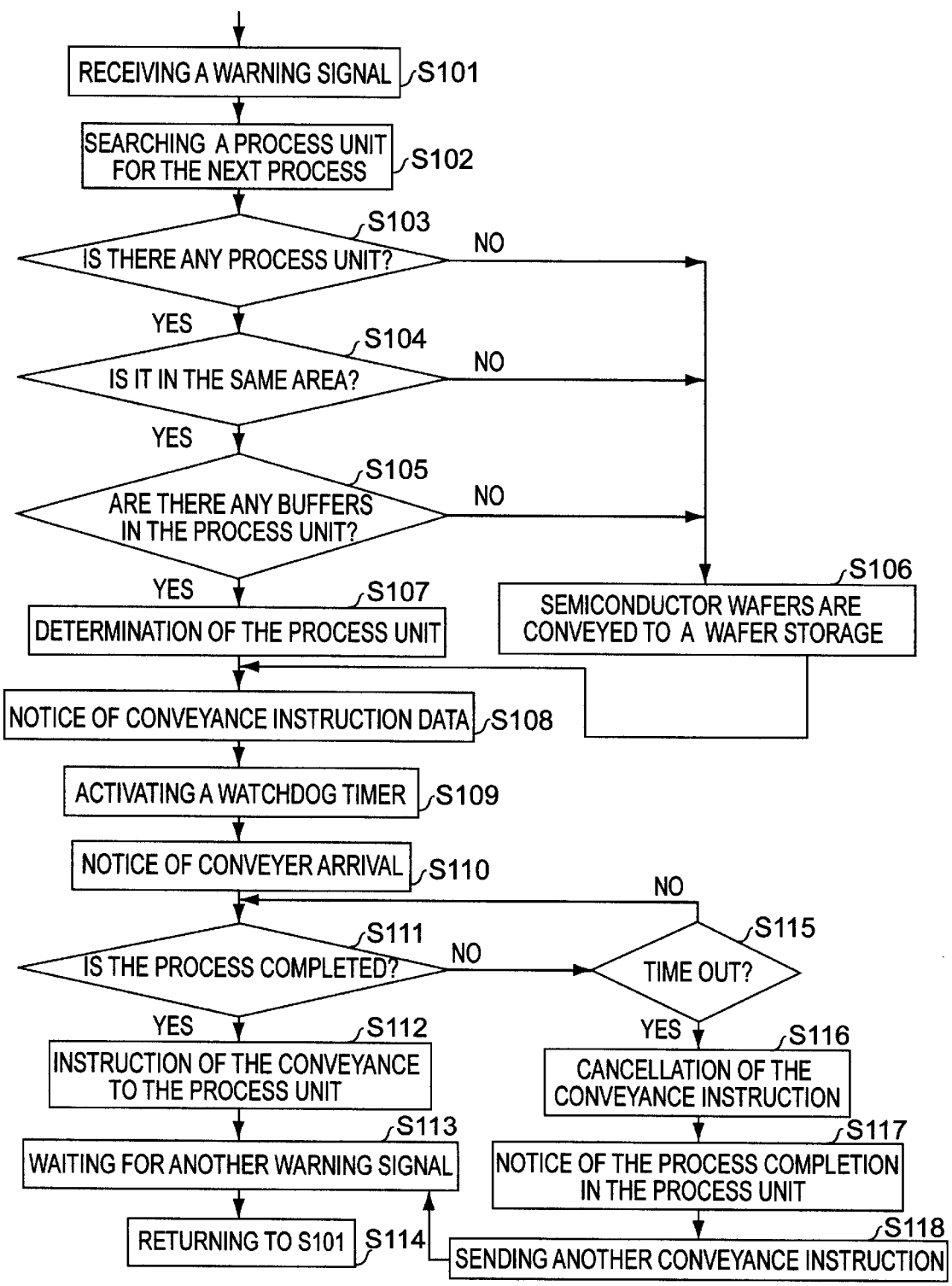
FIG. 3 is a flow chart showing the conveyance control in the manufacturing process of the semiconductor device, of the preferred embodiment of the invention.
Figure 4:
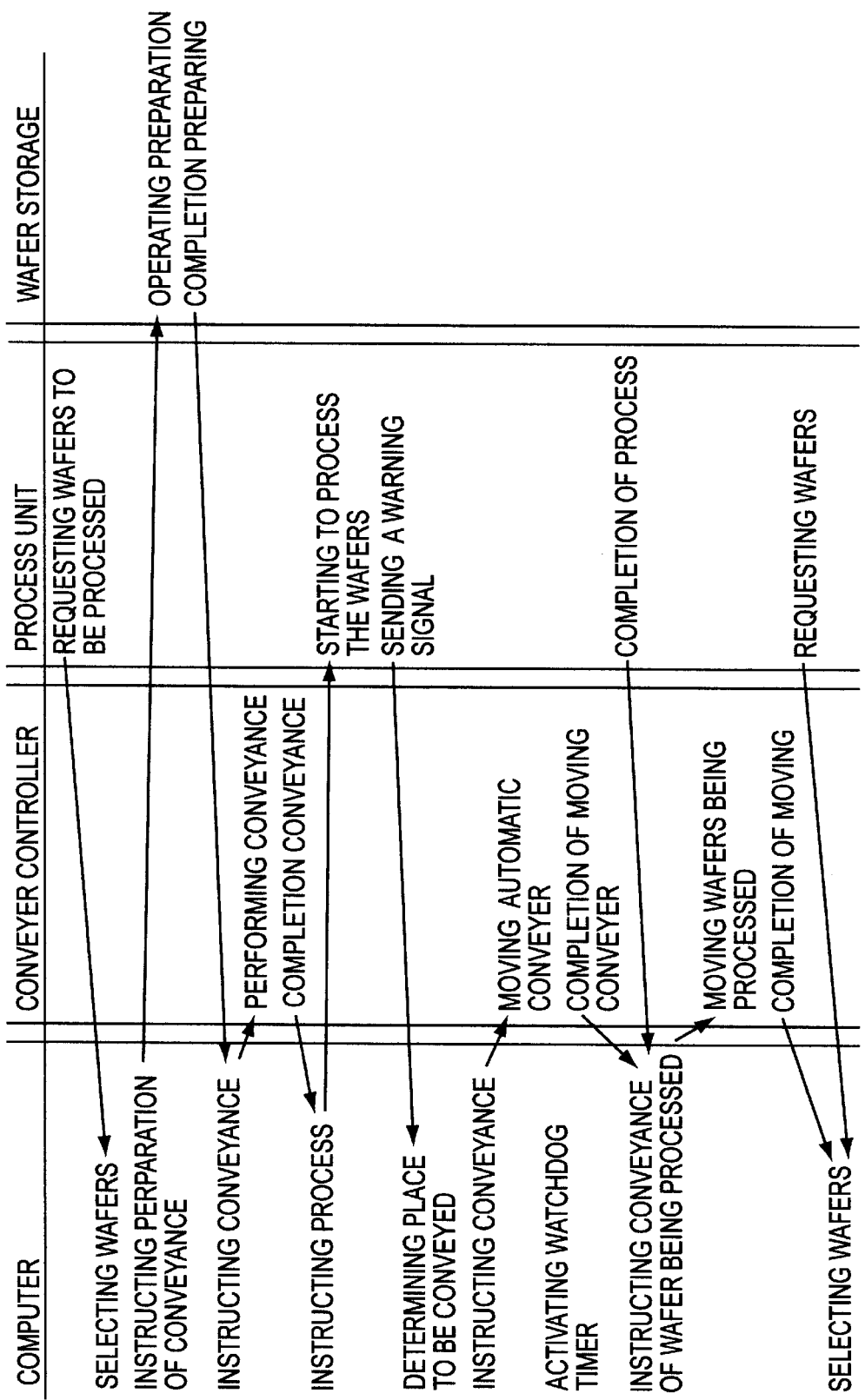
FIG. 4 is a communication sequence chart showing the conveyance control system in the manufacturing process of a semiconductor device, of the preferred embodiment of the invention.

Referring FIG. 3 and FIG. 4, the preferred embodiment of the method for controlling the conveyance of the semiconductor wafers to be processed is explained below.

The semiconductor wafers are processed in the process unit 6. In the process unit 6, an warning signal, which includes information showing the time when the process to the semiconductor wafers are completed, is sent to the computer 8 from the process unit 6 before the process is completed. The warning signal is usually sent to the computer 8 few minutes before the completion of the process <S101>. After the computer receives the warning signal, the computer 8 searches a possible process unit in which the next process is performed to the semiconductor wafers, from the data which shows the availability of the process unit <S102>. The data as the status report of the process unit is regularly sent to the computer 8 from each of the process units. Then, a place where the semiconductor wafers should be conveyed is determined by the computer 8 <S103–S107>. If there is no process unit available for the next process step to be performed to the semiconductor wafers, the wafer storage 2 is designated as the conveyance place <S106>. If there are some process units which are available for the next process to be performed to the semiconductor wafers, the computer 8 checks whether or not the process unit for the next process is located in the same area where the process unit 6 is located <S104>. If it is not, the wafer storage 2 is designated as the conveyance place <S106>. If it is, then the computer 8 further checks whether a buffer in the process unit is available for the conveying semiconductor wafers or not <S105>. If it is not, the wafer storage 2 is designated as the conveyance place <S106>. If it is, one process unit is designated as the place that the semiconductor wafers should be conveyed <S107>. For example, one of process units 7 in the FIG. 2 is designated as the place where the semiconductor wafers are conveyed to. The computer 8 sends a conveyance instruction date to the conveyer controller 5. The conveyance instruction data includes (a) a sequence number which is an identical positive and integral number, and which represents the conveyance instruction, (b) a stand-by position ID indicating a stand-by position of the semiconductor wafers being processed, namely the ID of the process unit 6, (c) a semiconductor wafers ID, (d) the first sending area information where the semiconductor wafers to be conveyed is located, and (e) a receiving area information where the semiconductor wafers are conveyed to <S108>. The first sending area information includes the ID mentioned in (b) and a port ID of the process unit 6. The receiving area information includes an ID of the process unit 7 and a port ID of the process unit 7. The automatic conveyer 3 is controlled by the conveyer controller 5 in response to the conveyance instruction data. Under the control, the automatic conveyer starts to move to the process unit 6 in which the semiconductor wafers being completed soon is located. A watchdog timer 9 in the process unit 6, which is set for the estimated time of the process completion, is activated by the computer 8 after the conveyance instruction is made <S109>.

After the automatic conveyer 3 reaches to the stand-by position in the process unit 6, the conveyer controller 5 sends the notice of the arrival to the computer 8 <S110>. As a completion signal indicating the completion of the process, is sent to the computer 8 from the process unit 6 after the process is actually completed as well as the system mentioned in the related art. The computer 8 can undersands whether or not the process has been completed in the process unit 6 when the computer 8 receives the notice of arrival <S111>.

In the case that the computer 8 received the completion signal from the process unit 6, the computer 8 send an instruction to the conveyer controller 5, for conveying the semiconductor wafers being processed from the process unit 6 to the process unit 7 for the next process step <S112>. Then, the semiconductor wafers are conveyer by the automatic conveyer 3 from the process unit 6 to the process unit 7. In this case, as the computer 8 had already received the completion signal, the semiconductor wafers in the process unit 6 can be conveyed out just after the automatic conveyer 3 reached the process unit 6. Then, the computer 8 waits for another warning signal from the process units <S113>. When the computer receives some warning signals, the operation mentioned above is repeated <S114>.

On the other hand, in the case that the computer 8 does not received the completion signal from the process unit 6 before the arrival signal is sent, the computer checks whether or not the time set by the watchdog timer 9 has passed by or not, namely, the time out <S115>. If there is no alarm by the watchdog timer 9 indicating the time out, the computer 8 checks again whether or not the process has been completed in the process unit 6 <S111>. If the computer 8 confirms the process completion before the time out by the watchdog timer 9, the computer 8 sends an instruction to the conveyer controller 5, for conveying the semiconductor wafers being processed to the process unit 7 for the next process step from the process unit 6, as mentioned above <S112>.

However, in spit of the alarm by the watchdog time 9 indicating the time out, there is a case that the process in the process unit has not completed yet. In this case, it is considered that something is wrong with the process unit 6. Therefore, the computer 8 sends a halt signal to the conveyer controller 5, for halting the conveyance of the semiconductor wafers in the process unit 6 <S116>. The automatic conveyer 3 which stands-by in front of the process unit 6 can be used for the other purposes by the cancellation, ex. the conveyance of the another semiconductor wafers being processed in the another process unit, or another semiconductor wafers being unprocessed in the wafer storage.

If the computer 8 receives the completion signal from the process unit 6 after cancellation order has been made <S117>, the computer 8 sends another conveyance instruction data to the conveyer controller 5, for moving another automatic conveyer to the process unit 6 to pick the semiconductor wafers up by the another automatic conveyer <S118>. After that, the computer 8 waits for another warning signal from the process units <S113>. When the computer receives some warning signals, the operation mentioned above is repeated <S114>.

According to the preferred embodiment of this invention, the semiconductor wafers being processed can be conveyed to the next process unit 7 just after the process is completed because the warning signal is sent to the computer 8 before the process completion. That is, the waiting time of the semiconductor wafers for the arrival of the automatic conveyer 3 can be reduced. As the result, the operating efficiency of the semiconductor manufacturing device can be improved, and TAT can be shortened in the manufacturing process of the semiconductor device. Further, some trouble in the process unit can be detected because of the installation of the watchdog timer 9 in the process unit. As the result, the automatic conveyer 3 can be used for any other purpose based on the cancellation of the conveyance.

Figure 5A:
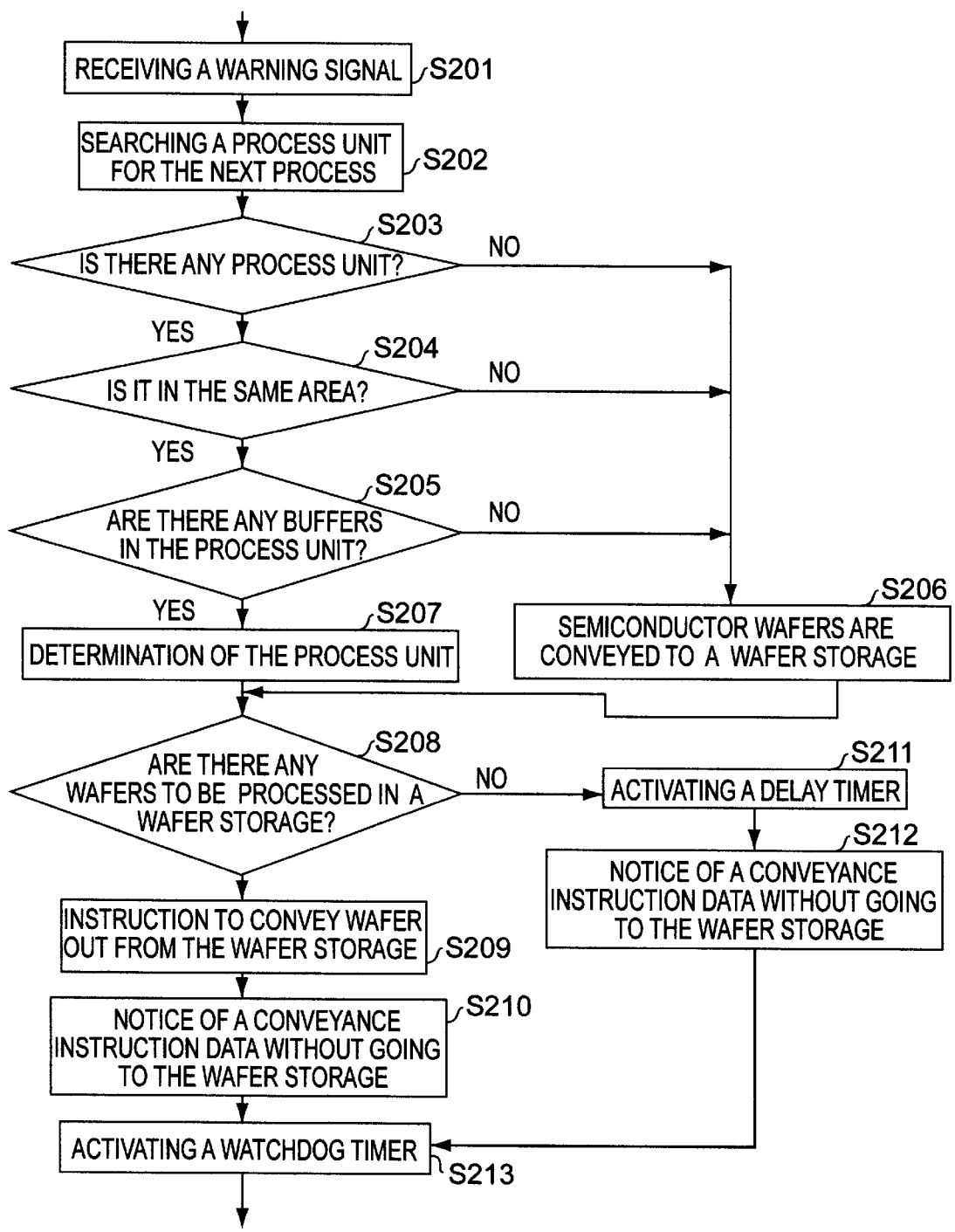
FIGS. 5A and 5B are a flow chart showing the conveyance control in the manufacturing process of the semiconductor device, of an alternative preferred embodiment of the invention, and, FIG. 6 is a communication sequence chart showing a conveyance control system in the manufacturing process of the semiconductor device, of the alternative preferred embodiment of the invention.
Figure 5B:
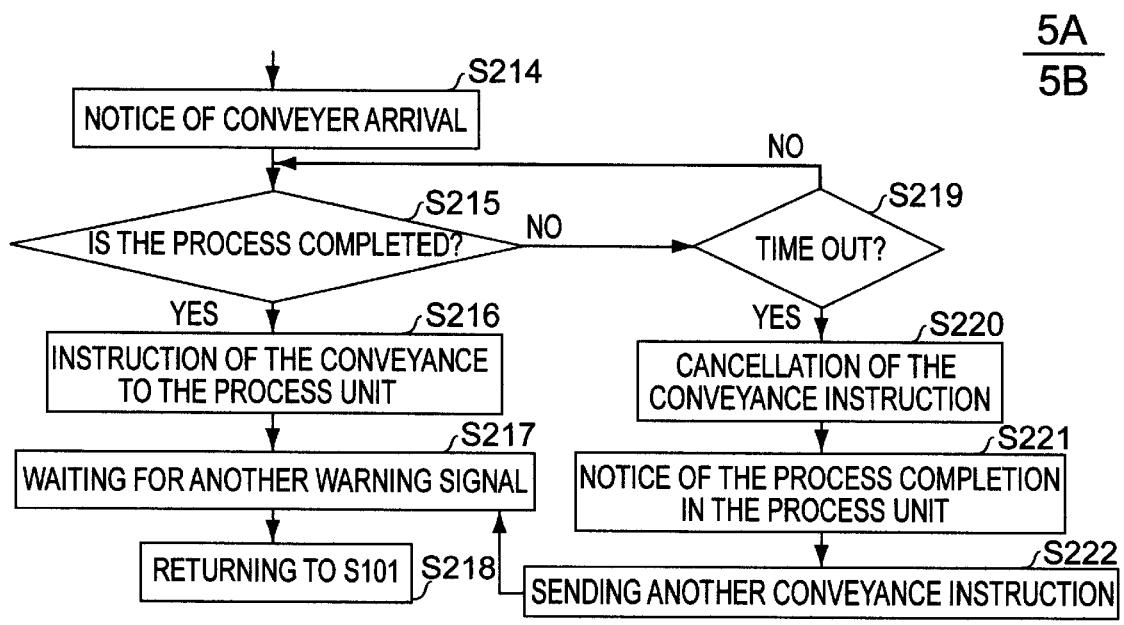
Figure 6:
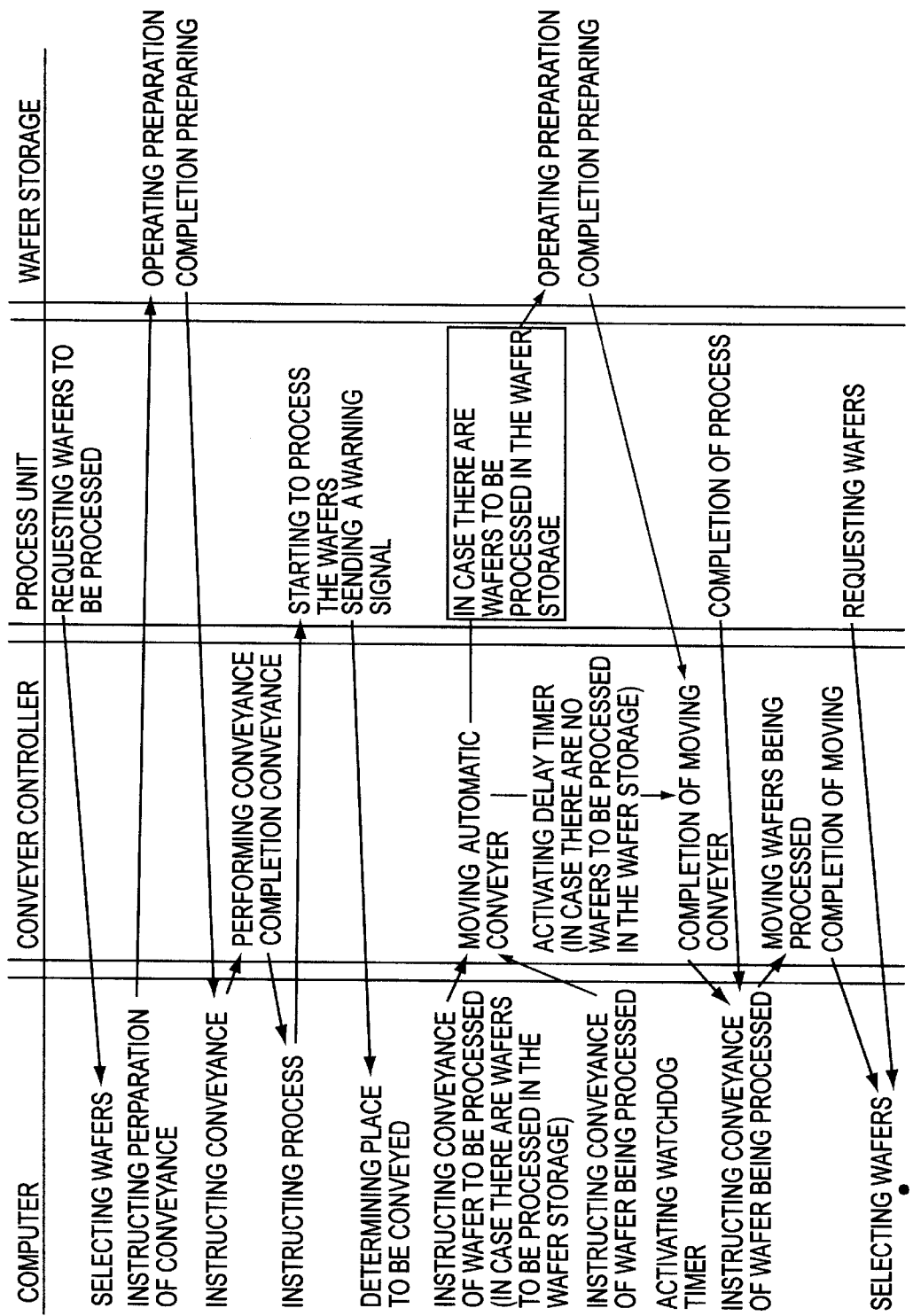

Referring to FIGS. 5A and 5B, and, FIG. 6, the difference between the FIGS. 5A and 5B and 6 and the first preferred embodiment is to add the step <S208>through the step <S212>between the step for determining the next process unit <S207>or for conveying the wafers to the storage <S206>and the step for activating the watchdog timer 9 <S203>. Therefore, the description from step <S201>through step <S207>and from step <S214>through step <S222>is omitted for easy understanding of the another preferred embodiment.

In the another preferred embodiment, before the computer 8 sends the first conveyance instruction data which include (a) the sequence number, (b) the stand-by position ID, (c) a first semiconductor wafers ID, (d) a first sending area information and (e) a first receiving area information, to the conveyer controller 5, the computer 8 confirms whether or not there is a semiconductor wafers in the wafer storage 2, which is to be processed in the process unit 6 <S208>.

In the case that there is a semiconductor wafers to be process in the wafer storage 2, the computer 8 sends an instruction to the wafer storage 2 for preparing to convey the semiconductor wafers <S219>. Then, after the computer 8 recognizes that the semiconductor wafers were prepared to convey, the computer 8 instructs the conveyer controller 5 with the second instruction data to convey the semiconductor wafers to be processed to the process unit 6, to convey the semiconductor wafers being processed out from the process unit 6 and to convey it to the process unit 7 for the next process <S210>. In addition to the first instruction data mentioned in the step, the second instruction data includes (a) a second semiconductor wafers ID which is the ID of the semiconductor wafers in the wafer storage 2 to be processed in the process unit 6 and (b) the second sending area information. The second sending area information includes the second semiconductor wafers ID and a port ID of the wafer storage 2. Then, the automatic conveyer 3 moves to the wafer storage 2 to pick the semiconductor wafers from the port in the wafer storage 2, and convey the semiconductor wafers to the process unit 6.

In the case that there is no semiconductor wafers to be process in the wafer storage 2, the automatic conveyer 3 moves to the process unit 6 based on the first instruction. When the computer 8 recognizes that there is not in the wafer storage 2, a delay timer 10 in the conveyer controller 5 is activated <S211>. The operation of the automatic conveyer 3 can be delayed for the period of time equal to the difference between Time A and Time B. Time A defines the arrival time of the automatic conveyer 3 from the current position of the automatic conveyer 3 to the process unit 6 via the wafer storage 2, and Time B defines the arrival time of the automatic conveyer 3 from the current position of the automatic conveyer 3 to the process unit 6 without stopping by the wafer storage 2. The computer 8 sends the first conveyance instruction data to the conveyer controller 5 <S212>. Then, the watchdog timer 9 is activated <S214>as the same manner mentioned in the preferred embodiment. After this, the operation form S214 through S222 is performed in the same manner which is mentioned in the first preferred embodiment.

According to the another preferred embodiment, the semiconductor wafers to be processed in the wafer storage 2 is picked by the automatic conveyer 3 in the way to the process unit 3 by checking whether there is the semiconductor wafers to be process in the wafer storage 2. Therefore, the semiconductor wafers being processed is conveyed out in the process unit 6 and the semiconductor wafers to be process is conveyed in the process unit at the same time. As the result, the operating efficiency of the semiconductor manufacturing device can be improved. Further as the operation of the automatic conveyer 3 can be delayed for the period of time equal to the difference between Time A and Time B, the automatic conveyer can be used efficiency. As the result, TAT can be shortened in the manufacturing process of the semiconductor device.

Further, in the step of <S220>, the conveyance instruction is once cancelled. In this situation, semiconductor wafers to be processed which are conveyed from wafer storage 2 are on the automatic conveyer 3, and the place to be conveyed is not fixed yet. Therefore, the computer 8 searches whether there is another process unit which the semiconductor wafers can be conveyed. If yes, the computer 8 sends an instruction to the conveyer controller 5 due to convey the semiconductor wafers to the newly searched process unit. If not, the semiconductor wafers are returned to the wafer storage 2.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What I claim is:

1. A conveyance system in a semiconductor manufacturing process, comprising:
    a process unit processing a semiconductor wafer;
    a conveyer conveying said semiconductor wafer;
    a conveyer controller controlling said conveyer;
    a computer controlling said conveyer and said conveyer controller,
    wherein said process unit sends a warning signal to said computer, presignifying time of the process completion in said process unit before said process is completed, and wherein said conveyer is moved to said process unit in response to said warning signal; and
    a watchdog timer for being set for an estimated time of the process completion in said process unit, wherein said watchdog timer is activated after said computer receives said warning signal.

2. A conveyance system as claimed in claim 1 wherein said conveyer is arranged to arrive at said process unit at the substantially same time as a completion of said process to said semiconductor wafer.

3. A conveyance system as claimed in claim 1, wherein an instruction including information that said conveyer moves to said process unit is sent from said computer to said conveyer controller after said computer receives said warning signal, and wherein said watchdog timer is activated after said instruction is sent to said conveyer controller.

4. A conveyance system as claimed in claim 3, further comprising:
    another process unit further processing said semiconductor wafer being processed in said process unit, said computer checking the availability of another process unit for receiving said semiconductor wafer being processed after said computer receives said warning signal and before said instruction is sent from said computer to said conveyer controller; and
    a wafer storage for storing semiconductor wafers;
    wherein said semiconductor wafer being processed is conveyed to another process unit if another process unit is available, and wherein said semiconductor wafer being processed is conveyed to said wafer storage if another process unit is not available.

5. A conveyance system as claimed in claim 1, wherein said computer checks whether said process in said process unit has been completed by receiving a completion signal indicating the process completion after said watchdog timer is activated;
    wherein said semiconductor wafer being processed in the process unit is loaded on said conveyer if said process in said process unit has been completed, and a semiconductor wafer to be process in said process unit is unloaded onto said process unit if there is said semiconductor wafer to be process in said process unit on said conveyer;
    wherein said computer check whether a time that said conveyer arrives at said process unit has passed by said estimated time of process completion, which was set by said watchdog timer if said process in said process unit has not been completed yet;
    wherein said computer checks again whether said process in said process unit has been completed if the time that said conveyer arrives at said process unit has not passed by said estimated time of process completion;
    wherein said computer notifies said conveyer controller to cancel to load said semiconductor wafer being process in said process unit if the time that said conveyer arrives at said process unit has passed by said estimated time of process completion.

6. A conveyance system as claimed in claim 1, further comprising:
    a wafer storage which stores a semiconductor wafer to be processed in said process unit;
    wherein said computer checks whether there is said semiconductor wafer to be processed in said wafer storage;
    wherein said conveyer moves to said wafer storage to pick up said semiconductor wafer to be processed in said wafer storage, and then moves to said process unit if there is said semiconductor wafer to be processed in said wafer storage; and
    wherein said conveyer moves directly to said process unit without stopping by said wafer storage if there is no semiconductor wafer to be processed in said wafer storage.

7. A conveyance system in a semiconductor manufacturing process, comprising:
    a process unit processing a semiconductor wafer;
    a conveyer conveying said semiconductor wafer;
    a conveyer controller controlling said conveyer;
    a computer controlling said conveyer and said conveyer controller,
    wherein said process unit sends a warning signal to said computer, presignifying time of the process completion in said process unit before said process is completed, and wherein said conveyer is moved to said process unit in response to said warning signal; and
    a wafer storage for storing a semiconductor wafer to be processed in said process unit;
    wherein said computer checks whether there is said semiconductor wafer to be processed in said wafer storage;

wherein said conveyer moves to said wafer storage to pick up said semiconductor wafer to be processed in said wafer storage, then moves to said process unit if there is said semiconductor wafer to be processed in said wafer storage; and wherein said conveyer moves directly to said process unit without stopping by said wafer storage if there is no semiconductor wafer to be processed in said wafer storage.

8. A conveyance system as claimed in claim 7, further comprising:

a delay timer for being set for a period of a time equal to the difference between a time that a conveyer reaches said process unit via said wafer storage and a time that a conveyer reaches said process unit directly, whereby an operation of said conveyer can be delayed for the period of time equal to the difference when there is no semiconductor wafer to be processed in said wafer storage.

9. A conveyance system as claimed in claim 7, wherein said conveyer is arranged to arrive at said process unit at the substantially same time as the process completion of said semiconductor wafer.

10. A method for processing a semiconductor wafer, comprising:

processing said semiconductor wafer in a process unit;

sending a warning signal to a computer from said process unit before said process is completed, said warning signal presignifying time of a process completion;

after sending said warning signal, sending an instruction to a conveyer controller from said computer, said instruction including information where a conveyer moves to and where said semiconductor wafer being processed is conveyed to;

activating a watchdog timer after sending said instruction, said watchdog timer being set for an estimated time of the process completion in said process unit; and conveying said semiconductor wafer being processed by said conveyer in response to said instruction.

11. A method for processing a semiconductor wafer as claimed in claim 10, further comprising:

checking whether a completion signal indicating process completion from said process unit is sent to said computer;

checking again whether said completion signal is sent if said watchdog timer shows time out; and canceling said instruction if said watchdog timer shows time out and if completion signal is not sent.

12. A method for processing a semiconductor wafer as claimed in claim 10, further comprising:

checking the availability of another process unit for receiving said semiconductor wafer being processed after said computer receives said warning signal and before said instruction is sent from said computer to said conveyer controller;

determining that said semiconductor wafer being processed is sent to another process unit if another process unit is available, and determining that said semiconductor wafer being processed is sent to a wafer storage if another process unit is not available.

13. A method for processing a semiconductor wafer as claimed in claim 10, wherein said conveyer arrives at said process unit at the substantially same time as the process completion of said semiconductor wafer.

14. A method for processing a semiconductor wafer as claimed in claim 10, further comprising:

activating a watchdog timer after sending said instruction, said watchdog timer being set for an estimated time of process completion in said process unit;

checking whether a completion signal indicating process completion from said process unit is sent to said computer;

checking again whether said completion signal is sent if said watchdog timer shows time out; and canceling said instruction if said watchdog timer shows time out and if said signal is not sent.

15. A method for processing a semiconductor wafer as claimed in claim 10, further comprising:

activating a watchdog timer after sending said instruction, said watchdog timer being set for an estimated time of process completion in said process unit;

checking whether a completion signal indicating process completion from said process unit is sent to said computer;

dropping said semiconductor wafer to be processed at said process unit and picking up said semiconductor wafer being processed, and conveying said semiconductor wafer being processed by said conveyer in response to said instruction; and processing said semiconductor wafer conveyed from said wafer storage in said process unit.

16. A conveyance system, comprising:

a work piece;

a means for processing said work piece;

a means for conveying said work piece;

a means for controlling said conveyer; and a means for managing said conveying means and said controlling means;

wherein said processing means sends a signal to said managing means, indicating time of the process completion in said processing means before said process to the work piece is completed;

wherein said conveying means is moved to said processing means to pick up said work piece in response to said signal, a means for setting a estimated time of process completion in said processing means;

wherein said time setting means is activated after said managing means receives said signal;

a means for storing said work piece; and a means for delaying to move said conveying means for a period of a time equal to the difference between a time that a conveying means reaches said processing means via said storing means and a time that said conveying means reaches said process unit directly.

17. A method for processing a semiconductor wafer, comprising:

processing said semiconductor wafer in a process unit;

sending a warning signal to a computer from said process unit before said process is completed, said warning signal presignifying time of a process completion; and checking whether there is a semiconductor wafer to be processed at said process unit in a wafer storage;

wherein a conveyer moves to said wafer storage to pick up said semiconductor wafer to be processed in said wafer storage, and then moves to said process unit if there is said semiconductor wafer to be processed in said wafer storage; and wherein said conveyer moves directly to said process unit without stopping by said wafer storage if there is no semiconductor wafer to be processed in said wafer storage.

18. A method for processing a semiconductor wafer as claimed in claim 17, further comprising:

sending an instruction from said computer to said conveyer controller after said computer receives said warning signal, said instruction including information that said conveyer moves to said process unit;

checking the availability of another process unit for receiving said semiconductor wafer being processed after said computer receives said warning signal and before said instruction is sent from said computer to said conveyer controller;

determining that said semiconductor wafer being processed is sent to another process unit if another process unit is available, and determining that said semiconductor wafer being processed is sent to a wafer storage if another process unit is not available.

19. A method for processing a semiconductor wafer as claimed in claim 17, further comprising:

delaying a period of a time substantially equal to the difference between a time that said conveyer reaches said process unit via said wafer storage and a time that a conveyer directly reaches said process unit without stopping by said wafer storage; and operating said conveyer with delay by the period of time substantially equal to the difference when there is no semiconductor wafer to be processed in said wafer storage.

20. A method for processing a semiconductor wafer as claimed in claim 17, wherein said conveyer arrives at said process unit at the substantially same time as the process completion of said semiconductor wafer.

21. A method for processing a semiconductor wafer, comprising: processing said semiconductor wafer in a process unit;

sending a warning signal to a computer from said process unit before said process is completed, said warning signal presignifying time of a process completion;

sending an instruction to a conveyer controller from said computer, said instruction including information where a conveyer moves to and where said semiconductor wafer being processed is conveyed to; and conveying said semiconductor wafer being processed by said conveyer in response to said instruction, wherein said conveyer arrives at said process unit at the substantially same time as the process completion of said semiconductor wafer.

22. A method for processing a semiconductor wafer as claimed in claim 21, further comprising:

activating a watchdog timer after sending said instruction, said watchdog timer being set for an estimated time of process completion in said process unit;

checking whether a completion signal indicating process completion from said process unit is sent to said computer;

checking again whether said completion signal is sent if said watchdog timer shows time out; and canceling said instruction if said watchdog timer shows time out and if said completion signal is not sent.

23. A method for processing a semiconductor wafer as claimed in claim 22, wherein checking the availability of another process unit for receiving said semiconductor wafer being processed after said computer receives said warning signal and before said instruction is sent from said computer to said conveyer controller;

determining that said semiconductor wafer being processed is sent to another process unit if another process unit is available, and determining that said semiconductor wafer being processed is sent to a wafer storage if another process unit is not available.

* * * * *